United States Patent
Furukawa et al.

(10) Patent No.: US 7,102,201 B2
(45) Date of Patent: Sep. 5, 2006

(54) STRAINED SEMICONDUCTOR DEVICE STRUCTURES

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 10/892,467

(22) Filed: Jul. 15, 2004

(65) Prior Publication Data

US 2006/0011990 A1 Jan. 19, 2006

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............. 257/382; 257/377; 257/383; 257/384; 257/385; 257/396; 257/397; 257/401; 257/496; 257/621; 257/622; 257/798; 257/E29.258

(58) Field of Classification Search ........ 257/382–385, 257/396–397, 401, 496, 621, 622, 798, 377, 257/E29.258
See application file for complete search history.

(56) References Cited

U.S. PATENT DOCUMENTS

| | | | |
|---|---|---|---|
| 3,566,215 A | 2/1971 | Heywang | |
| 4,866,494 A * | 9/1989 | Kurosawa | 257/303 |
| 5,343,051 A | 8/1994 | Yamaguchi et al. | |
| 5,412,240 A | 5/1995 | Inoue et al. | |
| 6,162,532 A | 12/2000 | Black et al. | |
| 6,222,233 B1 * | 4/2001 | D'Anna | 257/343 |
| 6,228,694 B1 | 5/2001 | Doyle et al. | |
| 6,281,547 B1 * | 8/2001 | So et al. | 257/330 |
| 6,433,396 B1 * | 8/2002 | Kinzer | 257/369 |
| 6,621,131 B1 | 9/2003 | Murthy et al. | |
| 6,900,523 B1 * | 5/2005 | Qu | 257/618 |
| 2002/0125527 A1 * | 9/2002 | Blanchard | 257/328 |
| 2003/0111699 A1 | 6/2003 | Wasshuber et al. | |
| 2003/0141549 A1 * | 7/2003 | Miyano et al. | 257/368 |
| 2004/0169220 A1 * | 9/2004 | Takemori et al. | 257/330 |

(Continued)

FOREIGN PATENT DOCUMENTS

EP 676815 A1 * 10/1995

(Continued)

OTHER PUBLICATIONS

K. Ismail et al., "High hole mobility in SiGe alloys for device applications," Appl. Phys. Lett., 64, No. 23, Jun. 6, 1994, p. 3124.

(Continued)

*Primary Examiner*—Ida M. Soward
(74) *Attorney, Agent, or Firm*—Wood, Herron & Evans, LLP (57) ABSTRACT

Semiconductor fabrication methods and structures, devices and integrated circuits characterized by enhanced operating performance. The structures generally include first and second source/drain regions formed in a body of a semiconductor material and a channel region defined in the body between the first and second source/drain regions. Disposed in at least one of the first and second source/drain regions are a plurality of plugs each formed from a volume-expanded material that transfers compressive stress to the channel region. The compressively strained channel region may be useful, for example, for improving the operating performance of p-channel field effect transistors (PFET's).

24 Claims, 4 Drawing Sheets

U.S. PATENT DOCUMENTS

2004/0185622 A1* 9/2004 Williams et al. ............ 438/270
2005/0009209 A1* 1/2005 Zambrano ...................... 438/3
2005/0012144 A1* 1/2005 Shirai et al. ................ 257/329
2005/0051833 A1* 3/2005 Wang et al. ................. 257/315

FOREIGN PATENT DOCUMENTS

JP         06252415 A2    9/1994
JP         07094705 A2    4/1995

OTHER PUBLICATIONS

D. K. Nayak et al., "Enhancement-Mode Quantum-Well $Ge_xSi_{1-x}$ PMOS," IEEE El. Dev. Letters, EDL-12, 154 (1991).

S. Tiwari, "Compound Semiconductor Device Physics," Academic Press (1992), pp. 408-410.

* cited by examiner

STRAINED SEMICONDUCTOR DEVICE STRUCTURES

FIELD OF THE INVENTION

The invention relates generally to semiconductor structures and devices and to a method for their fabrication and, more particularly, to fabrication methods and structures, devices and integrated circuits characterized by enhanced operating performance.

BACKGROUND OF THE INVENTION

Semiconductor devices, such as field effect transistors (FET's), are familiar building blocks of integrated circuits. Field effect transistors are formed from an electrically isolated body of semiconductor material, such as silicon, defined in a semiconductor substrate and include a channel region defined in the semiconductor body between a source region and a drain region. Carrier mobility in the channel region is an important consideration because of its direct influence on device performance. For example, transistor output current and switching performance may be improved by enhancing the carrier mobility in the channel region. One approach for enhancing the carrier mobility is to strain the crystal lattice of the semiconductor material by introducing either compressive stress or tensile stress. The strain resulting from the stress alters the electronic band structure of the constituent semiconductor material. As a result, the in-plane carrier mobility is significantly increased.

Biaxial tensile strain may be induced uniformly across an entire substrate by introducing, between the bodies of semiconductor material and the substrate, an intervening layer of a material having a lattice constant greater than that of the substrate. For example, a body of biaxially strained silicon may be produced by introducing a thin layer of silicon germanium between the substrate and the semiconductor bodies. The tensile strain increases the interatomic spacing of the bodies in the plane of the substrate, which enhances electron mobility in device channel regions of n-channel field effect transistors (NFET's).

Uniaxial compressive strain may be induced locally in a silicon layer by process optimizations. Small amounts of compressive stress may be introduced by manipulating the properties of existing device structures. For example, local strain caused by the thermal expansion mismatch of silicon and shallow-trench isolation has been demonstrated to produce amounts of strain sufficient to alter device characteristics. Greater amounts of compressive stress may be introduced by, for example, depositing a silicon germanium layer only in the source and drain regions of p-channel field effect transistors (PFET's). The local introduction of the silicon germanium layer has the effect of adding compressive strain to the PFET channel region, which locally increases hole mobility.

A limitation on this approach is that such strained devices are notoriously difficult to fabricate. In particular, the use of silicon germanium layers for forming strained silicon has certain disadvantages that prevent large scale integration. Silicon germanium layers tend to introduce defects into the overlying silicon bodies, which reduces device yields. Large scale integration is further limited because it is difficult to make strained NFET's and strained PFET's on a single substrate. For example, a layer of silicon germanium deposited across the wafer is not suitable for optimizing both NFET's and PFET's. Silicon germanium also has poor thermal conductivity. Some dopants diffuse more rapidly through silicon germanium, which may influence diffusion doping profiles in source and drain regions formed in the silicon bodies. Another practical limitation is that the silicon germanium layer contributes to increasing the overall thickness of the device structure, which is being scaled downwardly in modern device designs.

What is needed, therefore, is a method of selectively introducing compressive strain into the channel region of a semiconductor body, and structures, devices and integrated circuits having a compressively strained channel region fabricated by the method.

SUMMARY OF THE INVENTION

In accordance with the principles of the invention, structures, devices and integrated circuits having a strained channel region are formed by introducing compressive strain into the semiconductor material surrounding the channel region. The compressive strain is provided without introducing a silicon germanium layer. In one embodiment, such semiconductor structures generally include a conductive gate electrode, a gate insulator separating the gate electrode from a semiconductor body, first and second source/drain regions formed flanking the gate electrode, and a channel region defined in the body between the first and second source/drain regions. Disposed in at least one of the first and second source/drain regions are a plurality of plugs each formed from a volume-expanded material that transfers compressive stress to the channel region.

In another embodiment of the invention, a method of fabricating a semiconductor structure includes creating a pattern of open features in a masking layer overlying at least one of the first and second source/drain regions in a body of a semiconductor material and removing portions of the semiconductor material in the at least one of the first and second source/drain regions exposed by the nanoscale features to define trenches in the body. The trenches are filled with a volume-expanded material, which operates to compressively stress a channel defined in the body between the first and second source/drain regions.

In accordance with the invention, introducing plugs of volume-expanded material in the source/drain regions transfers compressive stress locally to a semiconductor region flanked by the source/drain regions. The induced compressive strain therein may improve one or more operational characteristics of the device, such as carrier mobility in the channel region, thereby improving the performance of semiconductor devices formed in and on the strained semiconductor region. In particular, devices and structures using the strained region as a channel region are expected to exhibit improved switching speed and low-power, low-voltage operation. The plugs of volume-expanded material are introduced into the device structure without significantly adding to the cost or complexity of the manufacturing process. For example, the strain may be introduced into the channel region of the device structure without reliance on complex film deposition techniques because the underlying insulating layer is altered without adding any additional layers to the device structure. Moreover, semiconductor regions may be strained while avoiding the various disadvantages associated with conventional silicon germanium layers and their introduction into device structures. In certain embodiments, the use of nanolithography provides nanometer scale feature sizes for the strained features in the source/drain regions impossible to obtain by conventional semiconductor lithography techniques. The strained structures, devices and integrated circuits of the invention are expected to be manufacturable in large-scale production with an acceptable yield.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
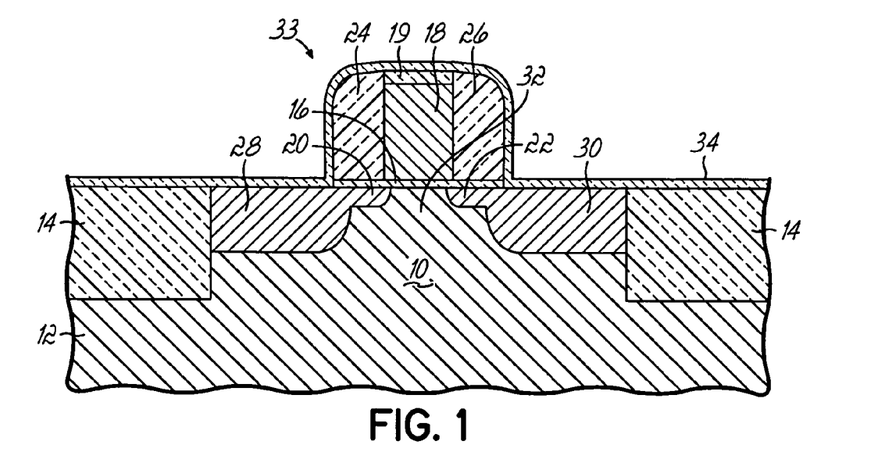
FIG. 1 is a diagrammatic cross-sectional view of a portion of a substrate.

With reference to FIG. 1, a number of body regions, of which a single body region 10 is depicted, are defined in a substrate 12 of a suitable semiconductor material such as silicon. Substrate 12 may be, for example, a bulk substrate or the active layer of a silicon-on-insulator (SOI) substrate. Adjacent body regions 10 are isolated electrically by shallow trench isolation (STI) regions 14. The STI regions 14 are formed by conventional STI isolation techniques, such as defining trenches in substrate 12, filling the trenches with a dielectric material like silicon dioxide ($SiO_2$) deposited by chemical vapor deposition, and planarizing to remove excess dielectric material by chemical-mechanical polishing (CMP) or any other suitable planarization technique such as an etch back process. The upper horizontal surfaces of the body regions 10 and the STI regions 14 are approximately level after planarization. It will be appreciated that other device isolation techniques, such as field oxide formation (e.g., LOCOS processing) or the like, may be used to electrically isolate the body regions 10.

A gate dielectric 16 is formed by a conventional process atop body region 10. Gate dielectric 16 may comprise an oxide (i.e., $SiO_2$) grown on the upper surface of body region 10 from either a dry oxygen ambient or steam and then patterned conventionally. The thickness of gate dielectric 16 may vary contingent upon the required device performance. Alternatively, the gate dielectric 16 may be formed from any of the many candidate high dielectric constant (high-k) materials, including but not limited to silicon nitride $Si_3N_4$, silicon oxynitride ($SiO_xN_y$), a gate dielectric stack of $SiO_2$ and $Si_3N_4$, and metal oxides like tantalum oxide ($Ta_2O_5$), as recognized by persons of ordinary skill in the art.

With continued reference to FIG. 1, a gate electrode 18, which is patterned by a conventional lithography and etch process by selectively removing portions of a conductive layer conformally deposited on substrate 12, is formed at the location of the gate dielectric 16. The gate dielectric 16 electrically isolates the gate electrode 18, which is typically 100 nm to 200 nm thick, from substrate 12. The constituent conductive material forming the gate electrode 18 may be any suitable conductive material including, but not limited to, polycrystalline silicon (polysilicon), amorphous silicon, a combination of amorphous silicon and polysilicon, and polysilicon-germanium, rendered conductive by the presence of a suitable dopant. Alternatively, the constituent material of the gate electrode 18 may be one or more metals, such as tungsten, hafnium, tantalum, molybdenum, titanium, or nickel, or a metal silicide, and may be deposited using physical vapor deposition, chemical vapor deposition, or any other technique known in the art. A cap 19 of an insulating material, such as four (4) nm to fifteen (15) nm of $Si_3N_4$, is formed on an upper surface of gate electrode 18.

Source/drain extensions 20, 22 are formed on opposite sides of gate electrode 18 by, for example, using a technique known to persons of ordinary skill in the art. Briefly, a dopant species suitable for p-type extensions 20, 22 is implanted into substrate 12 using the gate electrode 18 as a self-aligned ion implantation mask for lateral positioning, and the substrate 12 is thermally annealed to remove implantation damage and activate the dopant species. Sidewall spacers 24, 26 are then formed on the gate electrode 18 from a material, such as $Si_3N_4$, as is familiar to persons of ordinary skill in the art. The gate electrode 18 and sidewall spacers 24, 26 act as a self-aligned mask for implanting a dopant species to form source/drain regions 28 and 30. As used herein, the phrase "source/drain region(s)" describes a region that may serve as either a source or a drain depending upon whether connected to source voltage or drain voltage. The technique of implanting dopant species to form source/drain regions 28 and 30 is familiar to persons of ordinary skill in the art. Briefly, a dopant species suitable for p-type source/drain regions 28 and 30 is implanted into substrate 12 using gate electrode 18 and sidewall spacers 24, 26 as a self-aligned ion implantation mask for lateral positioning and the substrate 12 is subsequently thermally annealed to remove implantation damage and activate the dopant species. Ion doses are typically on the order of about $1\times10^{15}$ atoms/cm$^2$ or greater, of a suitable p-type impurity with an implant energy in the range of 1 keV to 50 keV. A portion of substrate 12 defined between the source/drain regions 28 and 30 comprises a channel region, generally indicated by reference numeral 32, having a resistivity that is controlled by voltage supplied from a power supply to the gate electrode 18 and electrostatically coupled to the channel region 32 through the gate dielectric 16. The resultant structure defines a semiconductor device structure, generally indicated by reference numeral 33, that may be a p-channel field effect transistor (PFET). It is appreciated by persons of ordinary skill in the art that n-channel field effect transistors (NFET's) may be formed by similar methods on and in other isolated body regions 10 across the semiconductor substrate 12.

With continued reference to FIG. 1, a hard mask 34 is conformally deposited across the semiconductor substrate 12 in order to provide a self-aligned oxidation barrier over the gate electrode 18 and to supply a hard mask for the transfer of a nanopattern into the portion of the semiconductor substrate 12 forming source/drain regions 28 and 30, as described below. To that end, a conformal blanket of the hard mask material, which may be about two (2) nanometers to about ten (10) nanometers of $Si_3N_4$, is applied over the semiconductor substrate 12 by a conventional process.

Figure 2A:
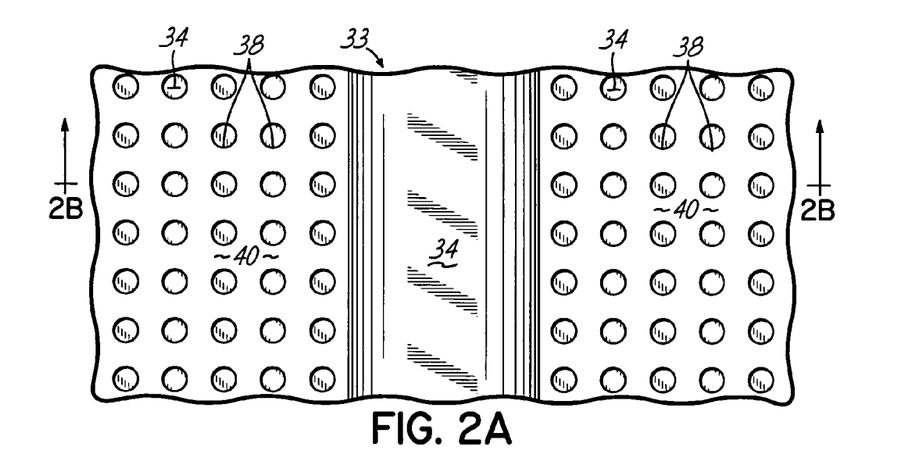
FIG. 2A is a diagrammatic top view at a subsequent fabrication stage of the portion of the substrate of FIG. 1.
Figure 2B:
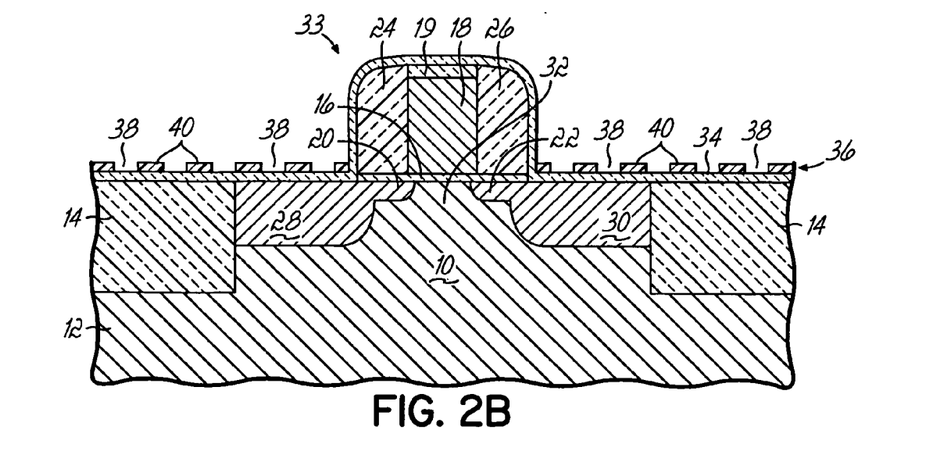
FIG. 2B is a diagrammatic cross-sectional view taken generally along lines 2B—2B of FIG. 2A.

With reference to FIG. 2 in which like reference numerals refer to like features in FIG. 1 and at a subsequent fabrication stage, a masking layer, generally indicated by reference numeral 36, is formed on the hard mask 34 across the semiconductor substrate 12 and, in particular, overlying the source/drain regions 28 and 30. The masking layer 36 generally includes an array of open features 38 defined in an otherwise non-perforated layer 40. Each features 38 extends through the thickness of the layer 40 to expose underlying areas of the hard mask 34. The array constitutes a two-dimensional arrangement of the open features 38 on the exposed surface of substrate 12 and, at the least, proximate to the gate electrode 18. The array may include regular, ordered features 38, as in, for example, a row-column matrix of openings, parallel slots, and the like. However, the array is not necessarily required to consist of regular and ordered features 38.

The open features 38 may consist of, for example, nearly cylindrical nanometer sized or nanoscale pores or openings or more complex nanoscale morphologies, such as lines or lamellae, that are usable as a lithographic mask for nanolithography. Such nanoscale open features 38 are characterized by a maximum feature size of about 2 nm to about 10 nm and the center-to-center distance between open features 38 of between about 2 nm to about 10 nm. The dimensions of open features 38 are exaggerated in FIG. 2 for purposes of clarity. The invention contemplates that temporary dummy structures (not shown) may be provided as vertically-projecting structures in regions lacking gate electrodes 18 to promote self-assembly in those otherwise planar regions.

In one embodiment of the invention, the masking layer 36 may be formed from any suitable self-assembled block copolymer capable of providing a nanometer scale pattern. Block copolymers generally include two chemically distinct polymer components, which are covalently linked end-to-end as a polymer chain that can be self-assembled into well-ordered arrays of spheres, cylinders or lamellae, depending on the volume fraction of the two components comprising the polymer chain. The block copolymer is applied as a thin film by any conventional method, such as spin-coating and waiting a time sufficient for the block copolymer to self-assemble. Spin coating provides a rapid means for producing uniform and reproducible thin films over large areas. The microstructure of the block copolymer and the orientation of the polymer components may be manipulated by, for example, application of an external field including but not limited to electric fields.

After application, one component of the block copolymer thin film is physically removed or chemically modified by an etching process, as understood by persons of ordinary skill in the art, to produce a lithographic mask with open features 38. One component of the block copolymer may be stable in a particular etching process, while another component of the block copolymer is removed by the etching process. The open features 38, which are defined as open spaces by the removal of the block copolymer component, in the masking layer 36 serve as a lithography mask for a subsequent etch of hard mask 34, as described below. The use of block copolymers for nanolithography is described, for example, in U.S. Pat. No. 5,948,470 (Harrison et al.), which is hereby incorporated by reference herein in its entirety. The use of block copolymers is also described in, for example, "Enabling Nanotechnology with Self-Assembled Block Copolymer Patterns," C. Park et al., Polymer 44 (2003) 6725–60, "Adsorption of Fluorinated $C_{60}$ on the Si(111)-(7×7) Surface Studied by Scanning Tunneling Microscopy and High-Resolution Electron Energy Loss Spectroscopy," Y. Fujikawa et al., Jpn. J. of Appl. Phys. 41 (2002) 245–49, and "Fullerene Materials," F. Wudl, J. Mater. Chem. 12 (2002) 1959–63.

Patterning of the semiconductor substrate 12 in source/drain regions 28 and 30 is performed, as described hereinbelow, using a series of etches that patterns the masking layer 36, patterns the hard mask 34 using the open features 38 in the masking layer 36 as an etch mask, and finally patterns the semiconductor substrate 12 in source/drain regions 28 and 30 using the patterned hard mask 34.

Figure 3:
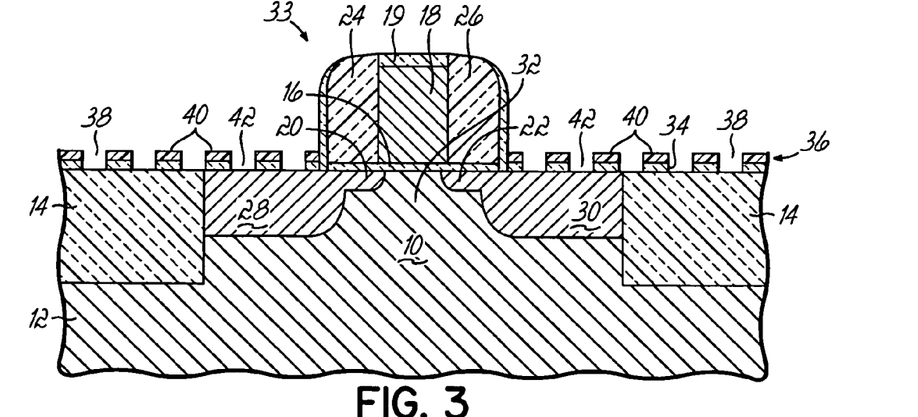
FIGS. 3–6 are diagrammatic cross-sectional views similar to FIG. 2B at subsequent fabrication stages.

With reference to FIG. 3 in which like reference numerals refer to like features in FIG. 2 and at a subsequent fabrication stage, the open features 38 in the masking layer 36 are transferred as a plurality of openings 42 to the hard mask 34 by anisotropic etching using, for example, a reactive ion etching (RIE) process that etches the material of the hard mask 34 exposed in open features 38 selective to the material forming semiconductor substrate 12 and to the material forming the STI regions 14. Regions of the hard mask 34 overlying the gate electrode 18 and spacers 24, 26 are thinned by the anisotropic etching. However, the cap 19 masks the gate electrode 18 to protect against erosion during the anisotropic etching. The openings 42 have the dimensions and geometry of the open features 38 in the masking layer 36.

Figure 4:
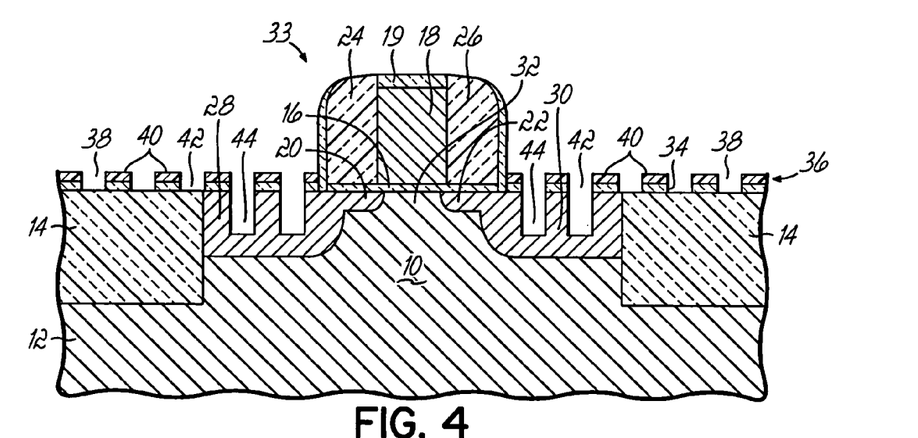

With reference to FIG. 4 in which like reference numerals refer to like features in FIG. 3 and at a subsequent fabrication stage, the openings 42 are transferred to the semiconductor substrate 12 in the source/drain regions 28 and 30 as trenches 44 formed by anisotropic etching using, for example, an RIE process that etches the material of the semiconductor substrate 12 in source/drain regions 28 and 30 selective to the material forming hard mask 34 and to the material forming the STI regions 14. Typically, the RIE process will be selective to $SiO_2$ and $Si_3N_4$. The depth of the trenches 44 is less than the junction depth of the source/drain regions 28 and 30. Although not shown, a resist layer is formed across the semiconductor substrate 12 that masks any body regions 10 bearing semiconductor devices, such as NFET's, for which the introduction of strain is unwanted.

Figure 5:
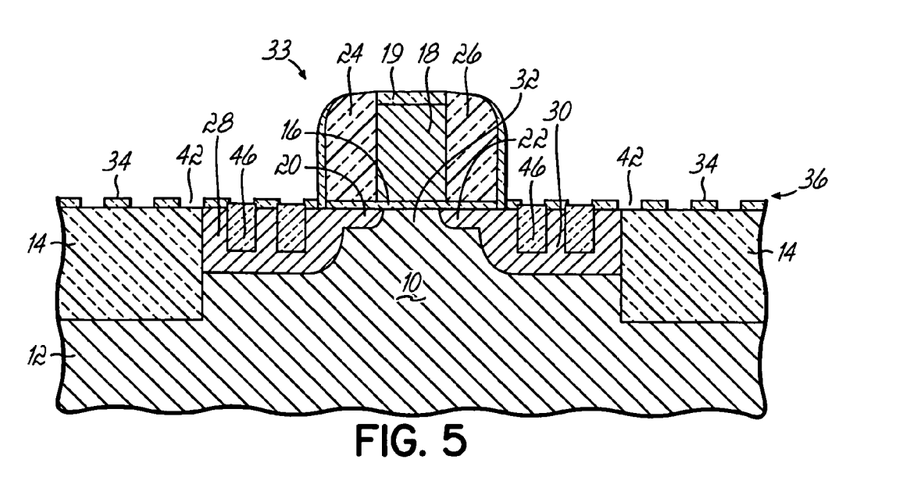

With reference to FIG. 5 in which like reference numerals refer to like features in FIG. 4 and at a subsequent fabrication stage, the masking layer 36 is stripped from the semiconductor substrate 12. The semiconductor substrate 12 may be cleaned using, for example, a standard RCA clean to remove any residue from the masking layer 36. The trenches 44 in the source/drain regions 28 and 30 are then filled with plugs 46 of a volume-expanded material that expand the surrounding material of semiconductor substrate 12. The plugs 46 may comprise an oxide (i.e., $SiO_2$) grown from either a dry oxygen ambient or steam that consumes portions of the semiconductor substrate 12 surrounding the trenches 44 during growth. When the size of the plugs 46 is approximately thirty-three (33) percent greater than the original size of the trenches 44, the plugs 46 completely fill the trenches 44. The diameter of the plugs 46 will range, assuming isotropic growth, from about three (3) nm to about fifteen (15) nm in diameter. In an alternative embodiment, the plugs 46 may comprise a silicon-germanium compound deposited by, for example, chemical vapor deposition using disilane ($Si_2H_6$) and germane ($GeH_4$) as source gases. The localized expansion of the semiconductor substrate 12 induces compressive stress in the channel region 32.

The volumetric expansion of plugs 46 stresses the semiconductor substrate 12 in channel region 32, which induces a net amount of strain into the semiconductor material of the portion of substrate 12 constituting the channel region 32. This net amount of strain, which is typically in the range of one-tenth to two-tenths of a percent, modifies the electrical properties of carriers (i.e., holes) in the channel region 32. This increase in mobility arises because of energy level changes in the band structure caused by these stresses. If the semiconductor substrate 12 is silicon, the stress is believed to increase carrier mobility in channel region 32 by as much as twenty percent or greater, which improves device performance. The characteristics of the plugs 46 may be regulated to influence the degree of stress introduced into the strained regions 32 by adjusting the amount of oxidation.

Figure 6:
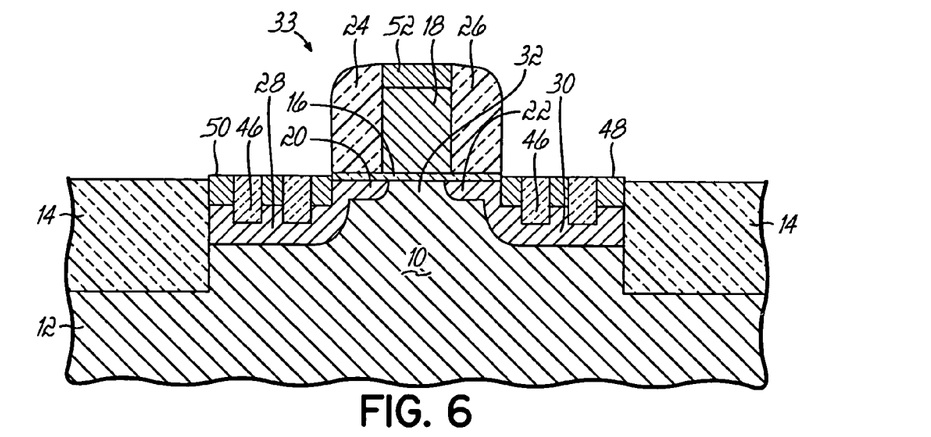

With reference to FIG. 6 in which like reference numerals refer to like features in FIG. 5 and at a subsequent fabrication stage, the hard mask 34 and cap 19 are stripped. Conductive contacts 48 and 50 are formed across the source/drain regions 28 and 30, respectively. Contacts 48 and 50 bridge the gaps between the sidewalls of adjacent plugs 46, which project vertically above substrate 12 due to the volume expansion. The process forming contacts 48, 50 may also fill the space above the gate electrode 18 vacated by cap 19 with a contact 52. Contacts 48 and 50 reduce contact resistance to the source/drain regions 28 and 30. The source/drain regions 28 and 30 are formed deeply enough to extend beyond the depth to which the contacts 48 and 50 are formed.

In one embodiment of the invention, the conductive material constituting contacts 48 and 50 is a silicide, such as $CoSi_2$, formed by a conventional silicidation process. For example, the contacts 48, 50 may be formed by depositing a thin conformal layer of the base metal of the silicide over source/drain regions 28 and 30, and then annealing to promote silicide formation over the coextensive contact area between the metal and underlying semiconductor material of semiconductor substrate 12, followed by stripping of any residual metal. If the gate electrode 18 is silicon, contact 52 above gate electrode 18 will likewise be a silicide.

Semiconductor device structure 33, device structures similar to device structure 33 in other body regions 10, and NFET devices (not shown) in still other body regions 10 are covered by a passivation dielectric, source/drain contacts and gate contacts are formed, and metal wiring is added to complete the circuit, as is familiar to persons of ordinary skill in the art. The invention contemplates that the plugs 46 provided in only one of the source/drain regions 28 and 30 may supply a stress to the channel region 32 effective to enhance operating performance, such as enhancing carrier mobility in the channel region 32. The invention also contemplates that the plugs 46 may be formed across the entire upper horizontal surface of one or both source/drain regions 28 and 30 or a portion of one or both of regions 28 and 30.

Figure 7:
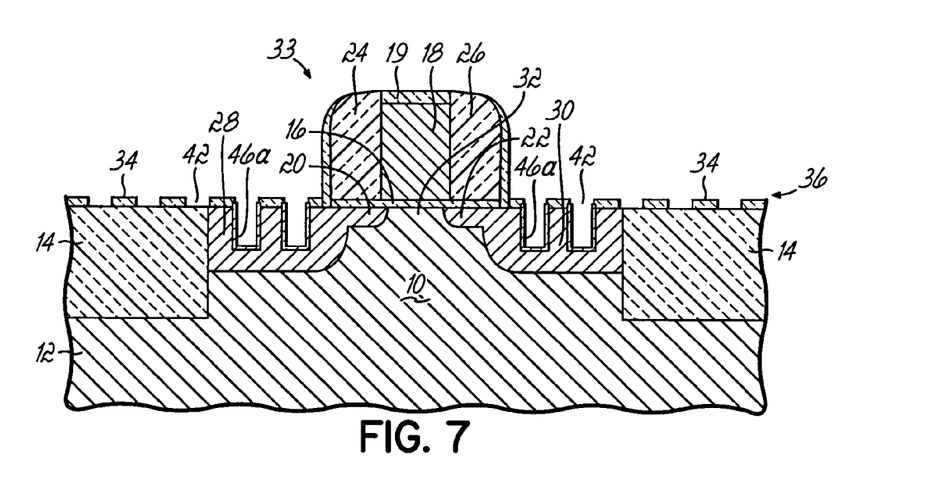
FIGS. 7 and 8 are diagrammatic cross-sectional views similar to FIGS. 5 and 6 in accordance with an alternative embodiment of the invention.

With reference to FIG. 7 in which like reference numerals refer to like features in FIG. 5 and in accordance with an alternative embodiment of the invention, the trenches 44 in the source/drain regions 28 and 30 may be filled with annular plugs 46a of $SiO_2$ covering the vertical sidewall of trenches 44. A cylindrical central core radially inward from each annular plug 46a remains vacant or unfilled. The plugs 46a may comprise an oxide (i.e.,) grown from either a dry oxygen ambient or steam, wherein the oxide growth process is interrupted before the central cores of plugs 46a are filled. The localized expansion of the semiconductor substrate 12 induces compressive stress in the channel region 32. The thickness of the plugs 46a is adjusted to tailor or select the amount of compressive stress. The maximum compressive stress is believed to be present in the channel region 32 between the source/drain regions 28 and 30 if the trenches 44 are completely filled with plugs 46, as shown in FIG. 5.

Figure 8:
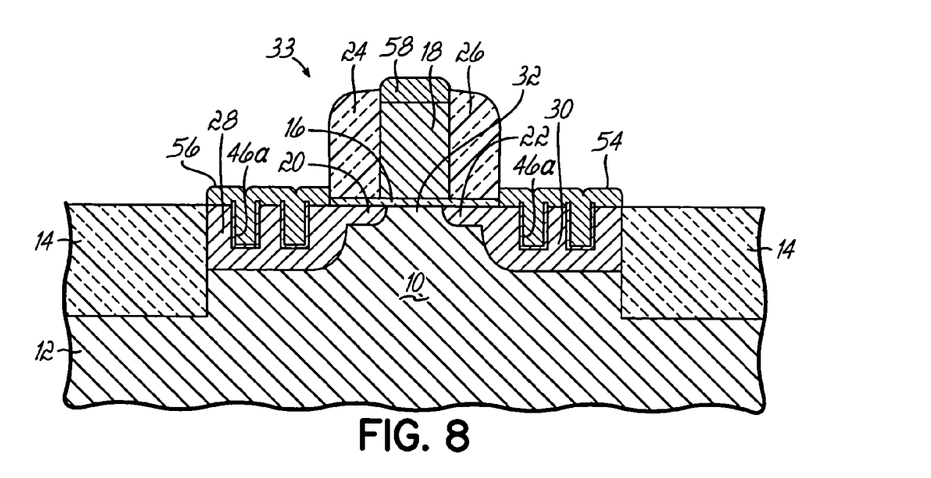

With reference to FIG. 8 in which like reference numerals refer to like features in FIG. 7 and at a subsequent fabrication stage, the hard mask 34 and cap 19 are stripped and contacts 54 and 56 are formed by deposition of a conductive material across the source/drain regions 28 and 30, respectively, of semiconductor substrate 12. Portions of the conductive contact 50 bridge the gaps between adjacent plugs 46a, which project vertically above substrate 12 due to the volume expansion, fill the vacant cylindrical cores defined radially inside of the annular plugs 46a, and cover the upper surfaces of the plugs 46a with a conducting material. The process forming contacts 54 and 56 also creates a contact 58 that fills the space above the gate electrode 18 vacated by cap 19. The conductive material forming opening 42 may be, for example, epitaxial silicon selectively grown by a conventional process. Alternatively, the contacts 54, 56 may also be used in conjunction with plugs 46 (FIG. 5). In yet another alternative embodiment, the contacts 54, 56 may constitute a silicide.

Figure 9:
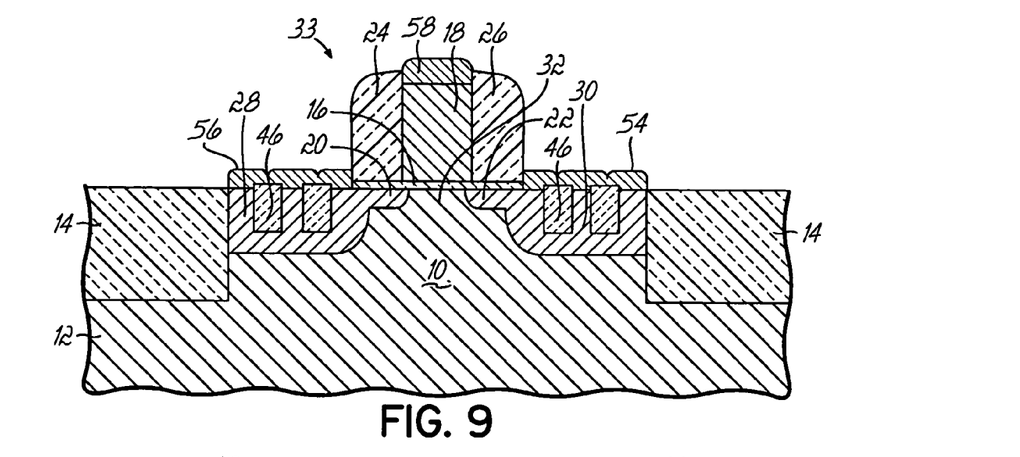
FIG. 9 is a diagrammatic cross-sectional view similar to FIG. 6 in accordance with an alternative embodiment of the invention.

With reference to FIG. 9 in which like reference numerals refer to like features in FIG. 5 and in accordance with an alternative embodiment of the invention, the plugs 46 are recessed vertically relative to the horizontal level of the upper surface of the source/drain regions 28 and 30 after the hard mask 34 and cap 19 are stripped and before the contacts 54 and 56 are formed. The plugs 46 may be recessed, for example, by an anisotropic reactive ion etch process that removes the material of plugs 46 selectively relative at least to the semiconductor substrate 12. The contacts 54 and 56 may be a silicide that bridges or, at the least, partially bridges across the surface of the plugs 46 to thereby increase the contact area on the source/drain regions 28 and 30.

Figure 10A:
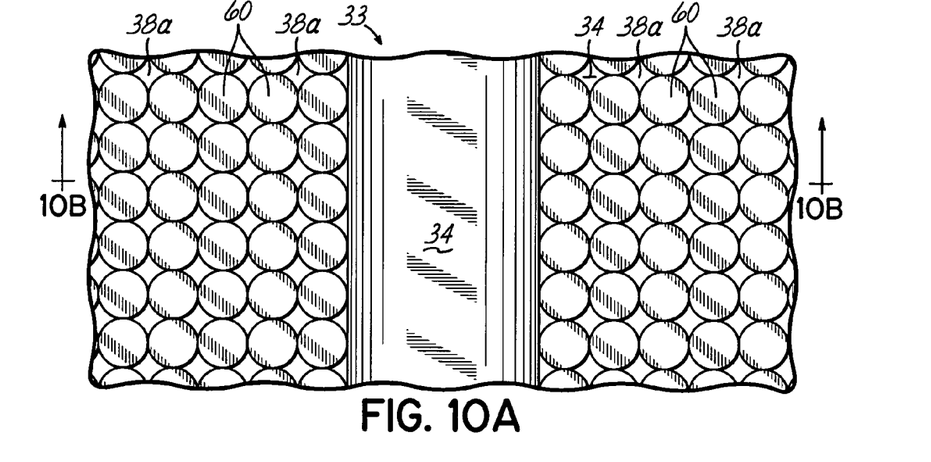
FIG. 10A is a diagrammatic top view similar to FIG. 2A in accordance with an alternative embodiment of the invention.
Figure 10B:
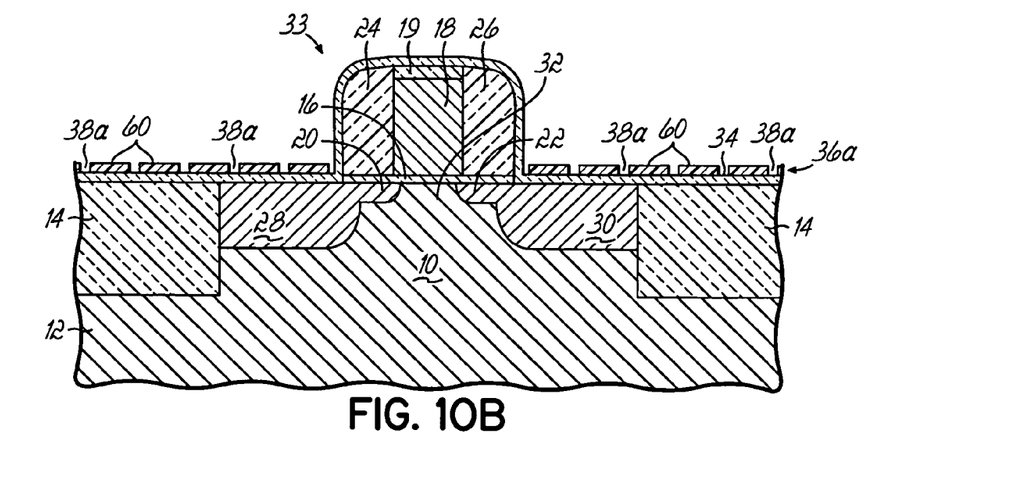
FIG. 10B is a diagrammatic cross-sectional view taken generally along lines 10B—10B of FIG. 10A.

With reference to FIGS. 10A and 10B in which like reference numerals refer to like features in FIGS. 2A and 2B and in accordance with an alternative embodiment of the invention, a pattern 36a generally includes an interconnected array of islands 60 and an array of open features 38a, each typically about two (2) nm to about ten (10) nm in diameter, defined in the interstices among the islands 60. Each individual island 60 shares a coextensive boundary with each nearest-neighbor island 60. To form the islands 60 of pattern 36a in accordance with one embodiment of the invention, small particles of a self-assembled material, such as $C_{60}$ particles, semiconductor particles, cobalt particles, or latex or other polymer spheres, are formed or deposited by a conventional method across at least the source/drain regions 28 and 30 and then enlarged to provide contact with nearest-neighbor islands 60. For example, the small particles may be covered with a layer of $SiO_2$ and etched, if necessary, such that the thinnest regions of $SiO_2$ are removed first to define the open features 38a. Methods of forming such patterns on silicon surfaces are disclosed in U.S. Pat. No. 5,338,571 (Mirkin et al.) and U.S. Pat. No. 6,579,463 (Winningham et al.), each of which is hereby incorporated by reference herein in its entirety. The fabrication sequence continues as in FIGS. 3–6 for the purpose of introducing compressive stress into the channel region 32.

References herein to terms such as "vertical", "horizontal", etc. are made by way of example, and not by way of limitation, to establish a frame of reference. The term "horizontal" as used herein is defined as a plane parallel to the conventional plane or surface of substrate 12, regardless of orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed without departing from the spirit and scope of the invention.

The fabrication of the semiconductor device has been described by a specific order of fabrication stages and steps. However, it is understood that the order may differ from that described. For example, the order of two or more steps may be altered relative to the order shown. Also, two or more steps may be carried out concurrently or with partial concurrence. In addition, various steps may be omitted and other steps may be added. It is understood that all such variations are within the scope of the invention.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A semiconductor device structure comprising:
   a body of a semiconductor material including a channel region;
   a conductive gate electrode;
   a gate insulator separating said gate electrode from said channel region of said body;
   first and second source/drain regions defined in the semiconductor material of said body, said first and second source/drain regions disposed on opposite sides of said gate electrode such that said channel region separates said first source/drain region from said second source/drain region; and
   a plurality of plugs disposed in at least one of said first and second source/drain regions, said plurality of plugs being formed from a volume-expanded material that transfers compressive stress to said channel region.

2. The semiconductor structure of claim 1 wherein the volume-expanded material forming said plurality of plugs comprises an insulating material.

3. The semiconductor structure of claim 1 wherein the semiconductor material of said body comprises silicon and said insulating material comprises silicon oxide.

4. The semiconductor structure of claim 1 wherein said compressive stress is effective to enhance carrier mobility in said channel region.

5. The semiconductor structure of claim 1 wherein said plurality of plugs extend to a first depth in said body that is less than a second depth of said first and second source/drain regions.

6. The semiconductor structure of claim 1 wherein said first and second source/drain regions include a p-type dopant species introduced into the semiconductor material of said body.

7. The semiconductor structure of claim 1 wherein at least two of said plurality of plugs are disposed in said first source/drain region and at least two of said plurality of plugs are disposed in said second source/drain region.

8. The semiconductor structure of claim 1 wherein the compressive stress transferred to said channel region operates to increase cater mobility in said channel region.

9. The semiconductor device structure of claim 1 further comprising:
   a plurality of dielectric-filled trenches arranged about the semiconductor material of the body, said dielectric-filled trenches providing electrical isolation for said first and second source/drain regions.

10. The semiconductor structure of claim 1 wherein the volume-expanded material forming said plurality of plugs comprises a silicon-germanium compound.

11. The semiconductor structure of claim 1 wherein adjacent pairs of said plurality of plugs are separated by a corresponding one of a plurality of gaps, and further comprising:
    a conductive material filling said plurality of gaps.

12. The semiconductor structure of claim 11 wherein each of said plurality of plugs is annular and includes a space filled with a portion of conductive material.

13. The semiconductor structure of claim 11 wherein said plurality of plugs are recessed and said conductive material overlies said plurality of plugs.

14. The semiconductor structure of claim 11 wherein said conductive material comprises a silicide.

15. The semiconductor structure of claim 11 wherein said conductive material covers said plurality of plugs.

16. The semiconductor structure of claim 1 wherein at least one of said plurality of plugs is circumscribed by said at least one of said first and second source/drain regions.

17. The semiconductor structure of claim 16 wherein the diameter ranges from about 3 nm to about 15 nm.

18. A semiconductor device structure comprising:
    a body of a semiconductor material including a channel region;
    a conductive gate electrode;
    a gate insulator separating said gate electrode from said channel region of said body;
    first and second source/drain regions defined in the semiconductor material of said body, said first and second source/drain regions disposed on opposite sides of said gate electrode such that said channel region separates said first source/drain region from said second source/drain region; and
    a plurality of plugs disposed in at least one of said first and second source/drain regions, said plugs being formed from a volume-expanded material that transfers compressive stress to said channel region, and each of said plugs having a diameter of less than about 15 nanometers.

19. The semiconductor device structure of claim 18 further comprising:
    a plurality of dielectric-filled trenches arranged about the semiconductor material of the body, said dielectric-filled trenches providing electrical isolation for said first and second source/drain regions.

20. The semiconductor structure of claim 18 wherein at least two of said plurality of plugs are disposed in said first source/drain region and at least two of said plurality of plugs are disposed in said second source/drain region.

21. The semiconductor structure of claim 18 wherein said plurality of plugs extend to a first depth in said body that is less than a second depth of said first and second source/drain regions.

22. The semiconductor structure of claim 18 wherein said first and second source/drain regions include a p-type dopant species.

23. The semiconductor structure of claim 18 wherein the volume-expanded material forming said plurality of plugs comprises a silicon-germanium compound.

24. The semiconductor structure of claim 18 wherein the volume-expanded material forming said plurality of plugs comprises an insulating material.

* * * * *